United States Patent
Kurosawa et al.

(10) Patent No.: US 9,263,261 B2
(45) Date of Patent: Feb. 16, 2016

(54) METHOD FOR SUPPLYING SOURCE GAS FOR PRODUCING POLYCRYSTALLINE SILICON AND POLYCRYSTALLINE SILICON

(71) Applicant: SHIN-ETSU CHEMICAL CO., LTD., Tokyo (JP)

(72) Inventors: Yasushi Kurosawa, Niigata (JP); Shigeyoshi Netsu, Niigata (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 14/435,316

(22) PCT Filed: Sep. 30, 2013

(86) PCT No.: PCT/JP2013/005802
§ 371 (c)(1),
(2) Date: Apr. 13, 2015

(87) PCT Pub. No.: WO2014/061212
PCT Pub. Date: Apr. 24, 2014

(65) Prior Publication Data
US 2015/0294864 A1  Oct. 15, 2015

(30) Foreign Application Priority Data
Oct. 16, 2012 (JP) .................. 2012-228643

(51) Int. Cl.
| C23C 16/24 | (2006.01) |
| C23C 16/50 | (2006.01) |
| C01B 33/027 | (2006.01) |
| H01L 21/02 | (2006.01) |
| C01B 33/02 | (2006.01) |
| C01B 33/035 | (2006.01) |

(52) U.S. Cl.
CPC .......... *H01L 21/02595* (2013.01); *C01B 33/02* (2013.01); *C23C 16/24* (2013.01); *C23C 16/50* (2013.01); *H01L 21/0262* (2013.01); *H01L 21/02532* (2013.01); *C01B 33/027* (2013.01); *C01B 33/035* (2013.01)

(58) Field of Classification Search
CPC ........ C23C 16/24; C23C 16/50; C01B 33/02; C01B 33/027; C01B 33/035; H01L 21/02595; H01L 21/02532; H01L 21/0262

USPC .......... 427/457, 569, 585, 588; 428/392, 398; 422/109, 198; 423/348, 349, 350; 438/72, 466, 486, 491, 710; 257/49, 257/E21.09, E21.102, E21.312, E29.003
See application file for complete search history.

(56) References Cited

U.S. PATENT DOCUMENTS

| 2011/0014468 A1* | 1/2011 | Urushihara ........... C01B 33/035 428/398 |
| 2011/0052914 A1* | 3/2011 | Urushihara ........... C01B 33/035 428/392 |
| 2011/0274851 A1* | 11/2011 | Miyazawa ............ C01B 33/035 427/546 |
| 2012/0207662 A1* | 8/2012 | Netsu .................... C01B 33/035 423/349 |
| 2012/0222619 A1* | 9/2012 | Netsu .................... C01B 33/035 118/723 R |
| 2013/0302528 A1* | 11/2013 | Kurosawa ............. C01B 33/035 |

FOREIGN PATENT DOCUMENTS

| JP | 05-139891 A | 6/1993 |
| JP | 2002-241120 A | 8/2002 427/457 |
| JP | 2003-128492 A | 5/2003 |
| JP | 2006-206387 A | 8/2006 |
| JP | 2011-231005 A | 11/2011 |
| JP | 2013-173644 A | 9/2013 |
| WO | WO 2012/098598 A1 | 7/2012 |

OTHER PUBLICATIONS

International Search Report issued Jan. 7, 2014 in PCT/JP2013/005802 filed Sep. 30, 2013.

\* cited by examiner

*Primary Examiner* — Dao H Nguyen
(74) *Attorney, Agent, or Firm* — Oblon, McClelland, Maier & Neustadt, L.L.P.

(57) ABSTRACT

In a method according to the present invention, an occurrence ratio of popcorn is suppressed by adjusting kinetic energy of a source gas supplied to a reaction furnace for producing polycrystalline silicon with a Siemens method (flow velocity and a supply amount of the source gas in source gas supply nozzle ejection ports). Specifically, in performing deposition reaction of the polycrystalline silicon under a reaction pressure of 0.25 MPa to 0.9 MPa, when flow velocity of the source gas in gas supply ports of the source gas supply nozzles (9) is represented as u (m/sec), a source gas supply amount is represented as Q (kg/sec), and an inner volume of the reaction furnace (100) is represented as V (m$^3$), values of u and Q of each of the source gas supply nozzles (9) are set such that a total $\Sigma(Q \times u^2/V)$ of values $Q \times u^2/V$ is equal to or larger than 2500 (kg/m·sec$^3$).

9 Claims, 4 Drawing Sheets

METHOD FOR SUPPLYING SOURCE GAS FOR PRODUCING POLYCRYSTALLINE SILICON AND POLYCRYSTALLINE SILICON

TECHNICAL FIELD

The present invention relates to a producing technique for polycrystalline silicon and, more particularly, to a method of supplying a source gas into a reaction furnace for producing the polycrystalline silicon with the Siemens method.

BACKGROUND ART

Polycrystalline silicon is used as a material of a monocrystalline silicon substrate for semiconductor device manufacturing and a substrate for solar cell manufacturing. As a method of producing the polycrystalline silicon, the Siemens method is known. The Siemens method is a method of bringing a source gas containing chlorosilane into contact with a heated silicon core wire and thereby vapor-phase growing the polycrystalline silicon on the surface of the silicon core wire with a CVD method to obtain the polycrystalline silicon as a silicon rod.

When the polycrystalline silicon is vapor-phase grown by the Siemens method, two silicon core wires in the vertical direction and one silicon core wire in the horizontal direction are assembled in a square arch shape (U-shape) in a reaction furnace of a vapor-phase growing apparatus. Both the ends of the silicon core wires of the square arch shape (U-shape) are fixed to a pair of metal electrodes, which are disposed on a reaction furnace bottom plate, via a pair of core wire holders. A supply port of a source gas for causing reaction and an exhaust port of a reaction exhaust gas are also disposed on the bottom plate. Such a configuration is disclosed in, for example, Japanese Patent Laid-Open No. 2011-231005 (Patent Literature 1).

In general, in a reaction furnace, several tens of the silicon core wires of the square arch shape (U-shape) fixed to the pair of metal electrodes disposed on the bottom plate are provided and are disposed in a multiple annular type. In recent years, according to an increase in demands for the polycrystalline silicon, an increase in the size of a reaction furnace for increasing production has been advanced. A method of depositing a large amount of the polycrystalline silicon in one batch is adopted. According to this tendency, the number of silicon core wires disposed in the reaction furnace also increases.

However, when the number of silicon core wires set in the reaction furnace increases, a short supply of chlorosilane to respective polycrystalline silicon rod surfaces occurs. Such supply instability of the source gas causes unevenness (popcorn) on the surface of the silicon rod. As a result, the thickness of the silicon rod becomes non-uniform and a shape failure occurs. When the unevenness occurs on the silicon rod surface, the polycrystalline silicon tends to abnormally grow. Further, a cleaning effect in cleaning before shipment of the polycrystalline silicon is greatly deteriorated. To eliminate the unevenness of the silicon rod surface, the temperature (reaction temperature) of the surface of the silicon rod only has to be lowered to moderate a deposition reaction. However, in this case, deposition speed of the polycrystalline silicon decreases and productivity and energy efficiency are markedly deteriorated.

Under such circumstances, as a method of suppressing the occurrence of the popcorn and improving the deposition speed for productivity improvement, various methods have been proposed as a method for efficiently supplying the source gas to the silicon rod surface. For example, in methods disclosed in Japanese Patent Laid-Open No. 2011-231005 (Patent Literature 1) and Japanese Patent Laid-Open No. 2003-128492 (Patent Literature 2), a source gas amount to be supplied to the silicon rod surface is adjusted to efficiently promote the deposition reaction by adjusting a source gas supply nozzle shape and a flow rate of the source gas to be supplied.

All of these prior patent literatures are techniques for improving productivity, that is, keeping the deposition speed of the polycrystalline silicon in a high state and reducing the popcorn by adjusting a reaction temperature and source gas concentration (a supply source gas amount) near the silicon rod surface in the reaction furnace.

On the other hand, the inventors propose a technique for preventing stagnation of the source gas in the reaction furnace and suppressing occurrence of popcorn and occurrence of silicon powder (Patent Literature 3: WO2012/098598).

In this technique, when the area of a bottom plate is represented as $S_0$, using a reaction furnace for polycrystalline silicon producing designed to provide all material supply nozzles on the inside of an imaginary concentric circle having the center in the center portion of the bottom plate and having an area $S=S_0/2$, a source gas is supplied from ejection ports of the source gas supply nozzles at flow velocity equal to or higher than 150 m/sec to form an overall reflux of the source gas in the reaction furnace such that a flow pattern of the reaction gas is an ascending current in a reaction furnace center portion and is a descending current in a reaction furnace outer wall side portion.

CITATION LIST

Patent Literature

Patent Literature 1: Japanese Patent Laid-Open No. 2011-231005
Patent Literature 2: Japanese Patent Laid-Open No. 2003-128492
Patent Literature 3: WO2012/098598

SUMMARY OF INVENTION

Technical Problem

In producing of polycrystalline silicon, chlorosilane serving as a source gas and hydrogen serving as a carrier gas are used. Reaction of these gases proceeds according to the following formulas. When temperature rises, reaction speed also increases. Therefore, from the viewpoint of productivity improvement for the polycrystalline silicon, it is necessary to raise a reaction temperature and increase the reaction speed.

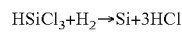

$$HSiCl_3 + H_2 \rightarrow Si + 3HCl$$

$$HSiCl_3 + HCl \rightarrow SiCl_4 + H_2$$

On the other hand, when the reaction temperature is raised, as described in Japanese Patent Laid-Open No. 2011-231005 (Patent Literature 1), the occurrence of the popcorn becomes conspicuous. Therefore, from the viewpoint of suppression of the occurrence of the popcorn, there is a limit in raising the reaction temperature.

Incidentally, as the reaction on the polycrystalline silicon rod surface, it is considered that, in the reaction furnace, the source gas passes a boundary layer near the polycrystalline silicon rod surface from a flow (a vapor phase) of the source gas and moves (diffuses) to the polycrystalline silicon rod surface (a solid phase) and reaction/deposition occurs. Speed of the diffusion affects reaction/deposition speed most. The diffusion speed depends on the concentration of the source gas in the gas phase, the thickness of the boundary layer, temperature, a gas type, and the like.

However, conventionally, reaction design for controlling the diffusion speed by adjusting a reaction temperature and gas-phase gas concentration is found. However, reaction design for controlling the diffusion speed by adjusting the thickness of the boundary layer is hardly found. In such conventional reaction design, a flow of the source gas is obtained from an ascending current (a natural convection current) generated by a temperature difference between the silicon rod surface having high temperature (1000 to 1200° C.) and the gas-phase source gas having low temperature (400° C. to 700° C.).

On the other hand, the method of producing the polycrystalline silicon proposed by the inventors in Patent Literature 3 is a method of changing a gas flowing state in the reaction furnace with energy of the source gas and creating an overall reflux of the source gas in the reaction furnace. The inventors considers that, with this method, it is possible to use forced convection in supplying the source gas into the reaction furnace and adjust, with the forced convection, the thickness of a boundary layer generated on the silicon rod surface.

The present invention has been devised on the basis of the above idea and it is an object of the present invention to cause forced convection of a source gas in a reaction furnace for producing polycrystalline silicon with the Siemens method and suppress, with energy of the forced convection, the thickness of a boundary layer (a diffusion layer of the source gas) formed between a gas phase and a solid phase to thereby suppress occurrence of popcorn.

Solution to Problem

In order to solve the problems, a method of supplying a source gas for polycrystalline silicon producing according to the present invention is a method of supplying a source gas to a reaction furnace for producing polycrystalline silicon with a Siemens method, the method including: using a reaction furnace in which one or more source gas supply nozzles are disposed such that a flow pattern of the source gas in the reaction furnace is an ascending current in a reaction furnace center portion and is a descending current in a reaction furnace outer wall side portion; and setting, in performing deposition reaction of the polycrystalline silicon under a reaction pressure of 0.25 MPa to 0.9 MPa, when flow velocity of the source gas in gas supply ports of the source gas supply nozzles is represented as u (m/sec), a source gas supply amount is represented as Q (kg/sec), and an inner volume of the reaction furnace is represented as V (m$^3$), values of u and Q of each of the source gas supply nozzles such that a total $\Sigma(Q \times u^2/V)$ of values $Q \times u^2/V$ is equal to or larger than 2500 (kg/m·sec$^3$).

Preferably, when the area of a bottom plate of the reaction furnace is represented as $S_0$, all of the one or more source gas supply nozzles provided in the reaction furnace are provided on the inner side of an imaginary concentric circle having the center in the center portion of the bottom plate and having an area S of $S_0/2$.

Preferably, a reaction temperature in performing the deposition reaction of the polycrystalline silicon under a reaction pressure of 0.25 MPa to 0.9 MPa is set in a range of 980° C. to 1150° C.

Preferably, when the source gas flow velocity u is obtained such that the total $\Sigma(Q \times u^2/V)$ is equal to or larger than 2500 (kg/m·sec$^3$), the pressure of the source gas supplied to the source gas supply nozzles is set to 1 MPa to 2 MPa.

The setting of the source gas pressure of 1 MPa to 2 MPa may be performed by at least one of compression pressurization by a compressor for the source gas and vaporization at high temperature of a liquid material.

Advantageous Effects of Invention

In the method according to the present invention, it is possible to suppress an occurrence ratio of popcorn by adjusting kinetic energy of the source gas supplied to the reaction furnace (flow velocity and a supply amount of the source gas in source gas supply nozzle ejection ports). Therefore, if the source gas is supplied by the method according to the present invention to manufacture the polycrystalline silicon with the Siemens method, occurrence of popcorn is suppressed. In addition, the kinetic energy of the source gas also serves as an index in scaling up the reaction furnace.

DESCRIPTION OF EMBODIMENT

An embodiment of the present invention is explained below with reference to the drawings.

Figure 1:
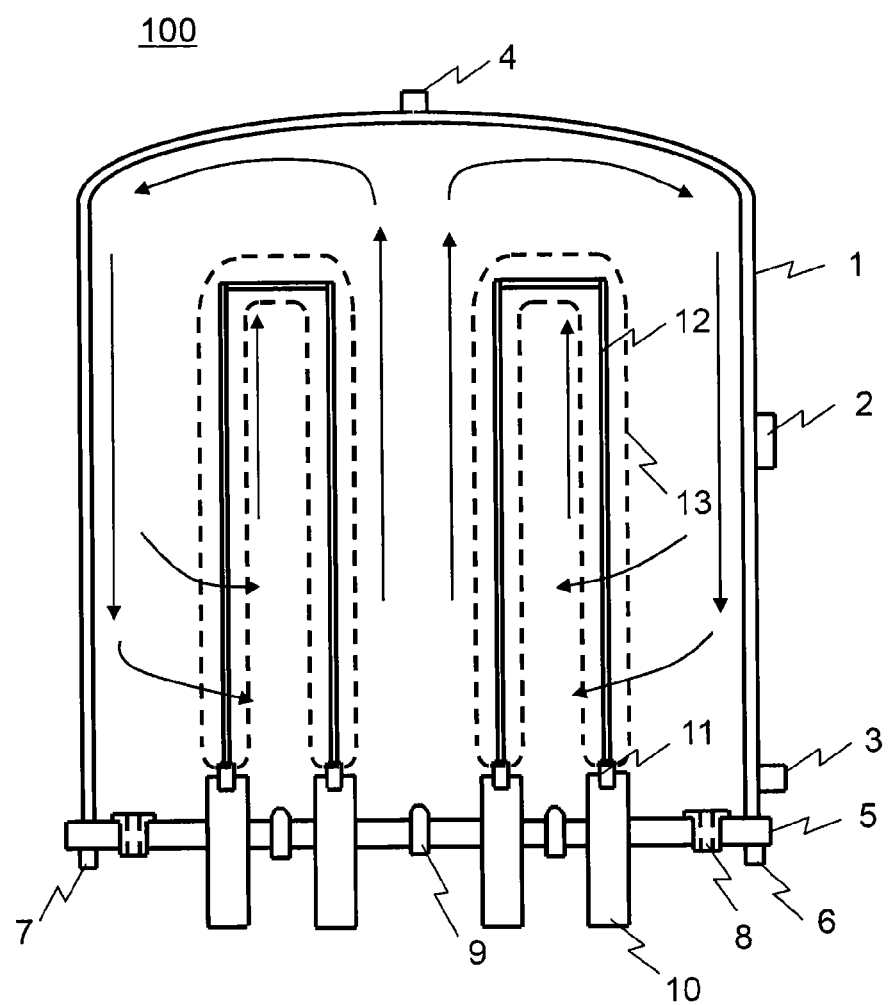
FIG. 1 is a sectional schematic view for explaining a configuration example of a reaction furnace for polycrystalline silicon producing of the present invention, wherein arrows indicate a circulation flow in a reaction furnace predicted to be caused by natural convection generated around polycrystalline silicon rods.

FIG. 1 is a sectional schematic view for explaining a configuration example of a reaction furnace 100 for polycrystalline silicon producing of the present invention. The reaction furnace 100 is a device that vapor-phase grows polycrystalline silicon on the surface of a silicon core wire 12 with the Siemens method and obtains a polycrystalline silicon rod 13. The inside of the reaction furnace 100 is closed by a bell jar 1 including an inspection window 2 for checking a state of the inside and a bottom plate 5. A plurality of the silicon core wires 12 assembled in a square arch shape are disposed in the closed space. The polycrystalline silicon is deposited on the surface of the silicon core wires (or silicon rods 13).

In the bottom plate 5, core wire holders 11 and metal electrodes 10 for energizing the silicon core wires 12 from both the ends of the silicon core wires 12 to cause the silicon core wires 12 to generate heat, gas supply nozzles 9 that supply a process gas such as a nitrogen gas, a hydrogen gas, or a trichlorosilane gas to the inside of the bell jar 1, and reaction exhaust gas ports 8 for discharging the gas after reaction to the outside of the bell jar 1 are set. Note that, in FIG. 1, three nozzles 9 are shown. However, one or more nozzles 9 only have to be provided.

Usually, the bottom plate 5 is formed in a disk shape. The metal electrodes 10, the nozzles 9, and the reaction exhaust gas ports 8 provided in the bottom plate 5 are often set on a concentric circle. As a source gas, a mixed gas of trichlorosilane and hydrogen is often used. A reaction temperature is relatively high at about 1000° C. to 1200° C. Therefore, a refrigerant inlet 3 and a refrigerant outlet 4 are respectively provided in a lower part and an upper part of the bell jar 1. A refrigerant inlet 6 and a refrigerant outlet 7 are also provided at both the ends of the bottom plate 5. A refrigerant is supplied to respective refrigerant paths of the bell jar 1 and the bottom plate 5 to perform cooling. Note that, as such a refrigerant, in general, water is used. An inner surface temperature of the bell jar 1 during deposition reaction is kept at about 150° C. to 400° C.

The core wire holders 11 made of carbon for fixing the silicon core wires 12 are set at the tops of the metal electrodes 10. The silicon core wires 12 are energized to raise a surface temperature to temperature of 1000 to 1200° C. with self-heat generation and the source gas is fed, whereby the polycrystalline silicon is deposited on the surfaces of the silicon core wires 12 to obtain polycrystalline silicon rods.

In the reaction furnace 100 used in the present invention, one or more nozzles 9 for source gas supply are disposed such that a flow pattern of the source gas in the furnace is an ascending current in a reaction furnace center portion and is a descending current in a reaction furnace outer wall side portion.

As the disposition of the nozzles 9 for forming such a flow pattern, as a simplest form, a form is possible in which when the area of the bottom plate 5 of the reaction furnace 100 is represented as $S_0$, all the nozzles 9 are provided on the inner side of an imaginary concentric circle having the center in the center portion of the bottom plate 5 and having an area S of $S_0/2$. In this case, if one nozzle 9 is provided in the reaction furnace 100, the nozzle 9 is preferably disposed in the center of the bottom plate 5. If a plurality of nozzles 9 are provided, the nozzles 9 are preferably disposed axis-symmetrically with respect to the center of the bottom plate 5.

As another form of the nozzle disposition, the nozzles 9 may be disposed on the outer side of a second imaginary concentric circle ($S=S_1/2$) having the center equal to the center of the first imaginary concentric circle with the area $S_1$ having the center in the center portion of the bottom plate 5 with the area $S_0$. However, in this case, to promote the overall circulation, a vector of blowout of the source gas from the nozzles 9 needs to be directed to the center direction of the bottom plate 5.

To promote the descending current of the overall circulation near the reaction furnace outer wall side portion in an upper part of the bell jar 1, auxiliary nozzles for source gas supply (not shown in the figure) may be disposed.

Note that, if the plurality of nozzles 9 are disposed, flow rates of the source gas supplied from the respective nozzles 9 may be the same or may be different. However, to create the overall circulation, flow velocity and a flow rate are preferably set equal for the nozzles 9 present in symmetrical positions with respect to the center of the reaction furnace 100.

As a circulation flow generated on the inside of the reaction furnace 100, there are a circulation flow generated by natural convection and a circulation flow generated by forced convection. The temperature (reaction temperature) of the silicon rods 13 in growing the polycrystalline silicon is preferably 950° C. to 1200° C. and more preferably 980° C. to 1150° C. In such a temperature range, there is little temperature dependency of the magnitude of the circulation flow generated by the natural convection.

On the other hand, a flow rate of the circulation flow formed by the forced convection of the source gas ejected from the nozzles 9 and an ambient gas flowing following the source gas is considered to be proportional to kinetic energy of the source gas. This is because an amount of the ambient gas following the source gas ejected from the nozzles 9 is proportional to the kinetic energy of the source gas.

Therefore, in the present invention, as an index for controlling the thickness of a boundary layer for limiting diffusion of the source gas such as chlorosilane from a gas phase side to a solid phase side, which is a reaction site, when flow velocity of the source gas in the gas supply ports of the source gas supply nozzles 9 is represented as u (m/sec), a source gas supply amount is represented as Q (kg/sec), and an inner volume of the reaction furnace 100 is represented as V (m³), a total $\Sigma(Q \times u^2/V)$ of values $Q \times u^2/V$ is defined. $\Sigma(Q \times u^2/V)$ can be understood as an index of the kinetic energy of the source gas supplied into the reaction furnace 100 per unit volume and unit time.

If this $\Sigma(Q \times u^2/V)$ is defined as the index, it is easy to control the supply of the source gas from the gas phase to the silicon rod surfaces. This is extremely effective for preventing occurrence of popcorn. Since the index ($\Sigma(Q \times u^2/V)$) is generalized, even when a producing apparatus is changed in design or the reaction furnace is scaled up, narrow-down work for optimization of reaction conditions is made efficient.

Specifically, values of u and Q of each of the source gas supply nozzles 9 are set such that the $\Sigma(Q \times u^2/V)$ is equal to or larger than 2500 (kg/m·sec³). Note that, when the conditions are adopted, compared with the conditions adopted in Patent Literature 1 and Patent Literature 2, supply source gas flow velocity is set to markedly high velocity.

In the present invention, the deposition reaction of the polycrystalline silicon is performed under the reaction pressure of 0.25 MPa to 0.9 MPa. By setting such a pressure range, the thickness of the boundary layer is reduced. The effect of preventing occurrence of popcorn is improved.

Further, in the present invention, as explained above, the supply source gas flow velocity is set to the markedly high velocity compared with the conventional conditions. Therefore, when the source gas flow velocity u is obtained such that the $\Sigma(Q \times u^2/V)$ is equal to or larger than 2500 (kg/m·sec³), it is preferable to set the pressure of the source gas supplied to the source gas supply nozzles 9 high in advance (set the pressure to 1 MPa to 2 MPa).

Such setting of the source gas pressure is performed by, for example, compression pressurization by a compressor for the source gas, vaporization at high temperature of a liquid material, or a combination of the compression pressurization and the vaporization.

EXAMPLE

A relation between a value of the $\Sigma(Q \times u^2/V)$ and a popcorn occurrence ratio is examined.

As the reaction furnace, two reaction furnaces (a reaction furnace 1 and a reaction furnace 2) shown in Table 1 are used. As source gas supply nozzles of the reaction furnace 1, on a bottom plate having a diameter of 1.5 m, one source gas supply nozzle is disposed in the center and three source gas supply nozzles are three-fold symmetrically disposed on an imaginary circle having a radius of half-length of the distance between the center and the sidewall of the reaction furnace. As source gas supply nozzles of the reaction furnace 2, on a bottom plate having a diameter of 2.5 m, six source gas supply nozzles are six-fold symmetrically disposed on an imaginary circle having a radius of one-third length of the distance between the center and the sidewall of the reaction furnace.

Figure 2A:
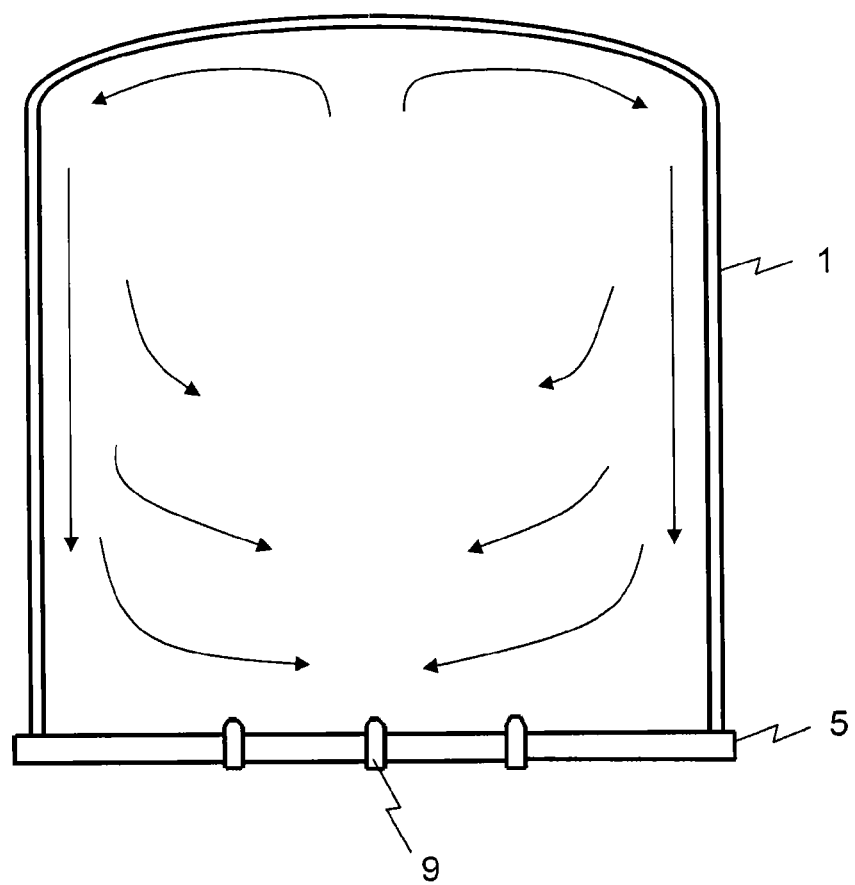
FIG. 2A is a diagram showing an in-furnace circulation flow of a reaction furnace 1 used in an embodiment.
Figure 2B:
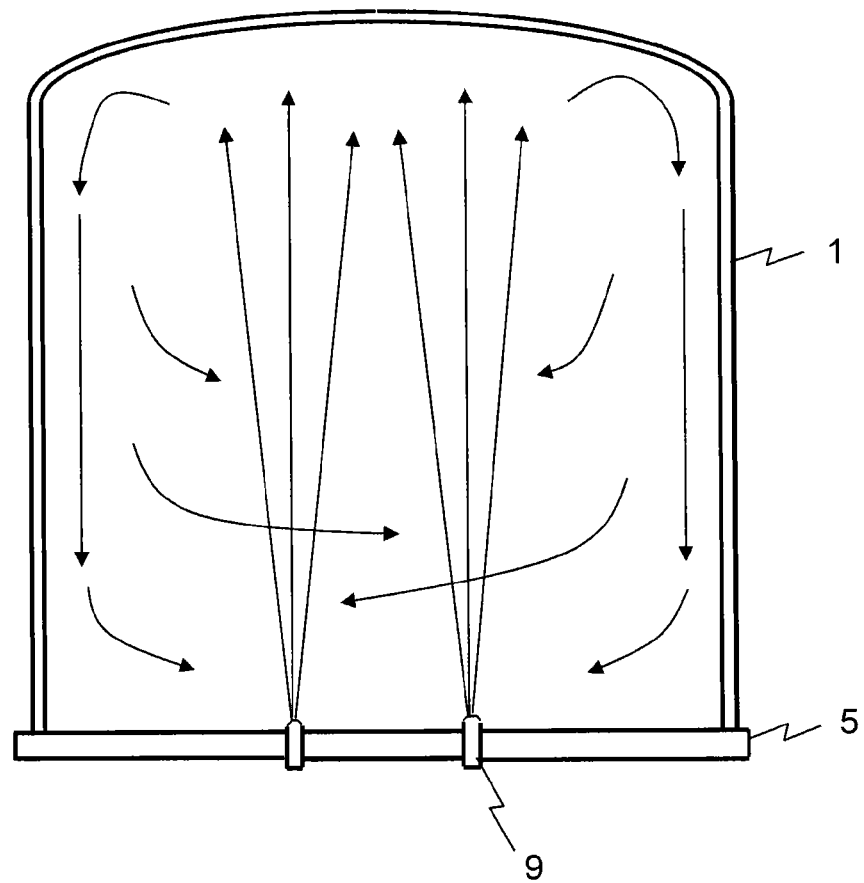
FIG. 2B is a diagram showing an in-furnace circulation flow of a reaction furnace 2 used in the embodiment.

In FIG. 2A and FIG. 2B, respective in-furnace circulation flows of the reaction furnace 1 and the reaction furnace 2 used in the example are shown. Both of the reaction furnace 1 and the reaction furnace 2 are reaction furnaces in which one or more source gas supply nozzles are disposed such that a flow pattern of the source gas in the reaction furnace is an ascending current in a reaction furnace center portion and is a descending current in a reaction furnace outer wall side portion.

As a silicon-containing gas, trichlorosilane was used. The silicon-containing gas was evaporated/pressurized by a heat exchanger heating system by steam and supplied. For a hydrogen gas serving as a carrier gas, a method of collecting/refining/compressor-pressurizing and reusing exhaust gas of the reaction furnace was adopted. The hydrogen gas was mixed with the trichlorosilane gas immediately before the source gas supply nozzles and supplied. A value of the index $\Sigma(Q \times u^2/V)$ was calculated using the mixed gas of trichlorosilane and hydrogen as the "source gas". Respective conditions of the source gas in the reaction furnace 1 and the reaction furnace 2 are shown in Table 2.

In both the batches, stagnation times of the source gas was adjusted to substantially fixed times, a hole diameter of nozzles for supplying the source gas was changed to change gas ejection speed and adjust kinetic energy of the source gas.

TABLE 1

Reaction furnace conditions

| | Reaction furnace 1 | Reaction furnace 2 |
|---|---|---|
| Reaction furnace inner volume | 5 m³ | 12 m³ |
| Reaction temperature | 1050° C. | 1050° C. |
| Reaction pressure | 0.45 MPaG | 0.5 MPaG |
| Bottom plate diameter | 1.5 m | 2.5 m |
| Source gas type | Trichlorosilane + hydrogen | Trichlorosilane + hydrogen |
| Silicon-containing gas concentration | 20 mol % | 20 mol % |

TABLE 2

Source gas conditions

| | Reaction furnace 1 | Reaction furnace 2 |
|---|---|---|
| Trichlorosilane pressure | 1.5 MPaG | 1.5 MPaG |
| Trichlorosilane temperature | 143° C. | 143° C. |
| Hydrogen gas pressure | 1.5 MPaG | 1.5 MPaG |
| Hydrogen gas temperature | 35° C. | 35° C. |

Figure 3:
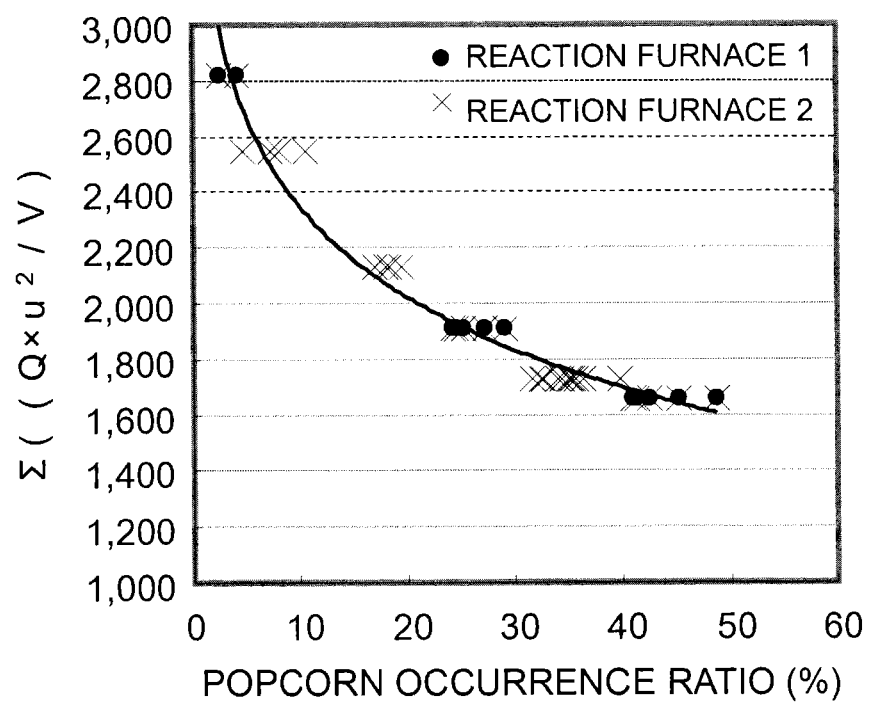
FIG. 3 is a diagram in which relations between occurrence ratios of popcorn in polycrystalline silicon rods obtained by batches of the embodiment and values of an index $\Sigma(Q \times u^2/V)$ are plotted.

Relations between occurrence ratios of popcorn in polycrystalline silicon rods obtained by the batches and values of the index $\Sigma(Q \times u^2/V)$ are shown in Table 3A and Table 3B. A diagram in which the results are plotted is shown in FIG. 3.

TABLE 3A

[Reaction furnace 1]

| Batch No. | Popcorn occurrence ratio | $\Sigma(Q \times u^2/V)$ |
|---|---|---|
| M082 | 25.2 | 1,912 |
| M083 | 27.3 | 1,912 |
| M085 | 24.6 | 1,912 |
| M086 | 25.3 | 1,912 |
| M087 | 24.3 | 1,912 |
| M088 | 29.2 | 1,912 |
| M090 | 48.7 | 1,654 |

TABLE 3A-continued

[Reaction furnace 1]

| Batch No. | Popcorn occurrence ratio | $\Sigma(Q \times u^2/V)$ |
|---|---|---|
| M093 | 40.9 | 1,654 |
| M097 | 41.3 | 1,654 |
| M101 | 42.4 | 1,654 |
| M103 | 45.1 | 1,654 |
| M104 | 2.5 | 2,821 |
| M105 | 4.2 | 2,821 |

TABLE 3B

[Reaction furnace 2]

| Batch No. | Popcorn occurrence ratio | $\Sigma(Q \times u^2/V)$ |
|---|---|---|
| G022 | 17.0 | 2,127 |
| G023 | 18.1 | 2,127 |
| G024 | 19.6 | 2,127 |
| G031 | 18.4 | 2,127 |
| G032 | 31.7 | 1,726 |
| G033 | 35.1 | 1,726 |
| G034 | 32.7 | 1,726 |
| G035 | 35.2 | 1,726 |
| G036 | 34.1 | 1,726 |
| G039 | 39.7 | 1,726 |
| G040 | 32.5 | 1,726 |
| G041 | 35.7 | 1,726 |
| G042 | 35.4 | 1,726 |
| G043 | 34.4 | 1,726 |
| G045 | 36.4 | 1,726 |
| G050 | 8.1 | 2,545 |
| G053 | 4.8 | 2,545 |
| G054 | 7.2 | 2,546 |
| G055 | 10.7 | 2,545 |
| M082 | 25.2 | 1,912 |
| M083 | 27.3 | 1,912 |
| M085 | 24.6 | 1,912 |
| M086 | 25.3 | 1,912 |
| M087 | 24.3 | 1,912 |
| M088 | 29.2 | 1,912 |
| M090 | 48.7 | 1,654 |
| M093 | 40.9 | 1,654 |
| M097 | 41.3 | 1,654 |
| M101 | 42.4 | 1,654 |
| M103 | 45.1 | 1,654 |
| M104 | 2.5 | 2,821 |
| M105 | 4.2 | 2,821 |

It can be read from the result shown in FIG. 3 that there is a clear correlation between the occurrence ratios of popcorn and the values of the index $\Sigma(Q \times u^2/V)$. Even if different reaction furnaces are used, the correlation between the popcorn occurrence ratios and the index $\Sigma(Q \times u^2/V)$ is maintained.

The inventors understand this point as explained below. The two reaction furnaces have substantially the same heights and only the volumes thereof change according to the diameters of the bottom plates. Therefore, a ratio of a circulate flow rate and flow velocity of an internal circulation flow is the same in the two reaction furnaces. Consequently, the thicknesses of boundary layers generated on polycrystalline silicon rod surfaces having substantially the same diameters in the two reaction furnaces are in the same state. Diffusion amounts of the source gas diffusing from the gas phase through the boundary layers and reaching the solid phase are also the same. Since reaction temperatures are in substantially the same state, reaction velocities are also in the same state. In the two reaction furnaces, all the conditions are considered to be substantially the same conditions. As a result, the occurrence ratios of popcorn that occurs in the reaction furnaces are considered to be the same.

It is evident from the correlation shown in FIG. 3 that the popcorn occurrence ratio decreases as the kinetic energy of the source gas (the index $\Sigma(Q \times u^2/V)$) increases. It is seen that a high-quality polycrystalline silicon rod is obtained by setting the value of the index $\Sigma(Q \times u^2/V)$ large.

If polycrystalline silicon having the popcorn occurrence ratio equal to or lower than 10% is "high quality", when the deposition reaction of the polycrystalline silicon is performed under a reaction pressure of 0.25 MPa to 0.9 MPa, "high quality" polycrystalline silicon is obtained by setting values of u and Q of the source gas supply nozzles such that $\Sigma(Q \times u^2/V)$ is equal to or larger than 2500 (kg/m·sec$^3$).

As in the present invention, if the occurrence ratio of popcorn is controlled according to the value of the index $\Sigma(Q \times u^2/V)$, even when the producing apparatus is changed in design or the reaction furnace is scaled up, narrow-down work for optimization of reaction conditions is made efficient.

INDUSTRIAL APPLICABILITY

In the method according to the present invention, it is possible to suppress an occurrence ratio of popcorn by adjusting kinetic energy of the source gas supplied to the reaction furnace (flow velocity and a supply amount of the source gas in source gas supply nozzle ejection ports). Therefore, if the source gas is supplied by the method according to the present invention to manufacture the polycrystalline silicon with the Siemens method, occurrence of popcorn is suppressed. In addition, the kinetic energy of the source gas also serves as an index in scaling up the reaction furnace.

REFERENCE SIGNS LIST

100 Reaction furnace
1 Bell jar
2 Inspection window
3 Refrigerant inlet (bell jar)
4 Refrigerant outlet (bell jar)
5 Bottom plate
6 Refrigerant inlet (bottom plate)
7 Refrigerant outlet (bottom plate)
8 Reaction exhaust gas ports
9 Gas supply nozzles
10 Electrodes
11 Core wire holders
12 Silicon core wires
13 Polycrystalline silicon rods

The invention claimed is:

1. A method of supplying a source gas to a reaction furnace for producing polycrystalline silicon with a Siemens method, the method comprising:
using a reaction furnace in which one or more source gas supply nozzles are disposed such that a flow pattern of the source gas in the reaction furnace is an ascending current in a reaction furnace center portion and is a descending current in a reaction furnace outer wall side portion; and
setting, in performing deposition reaction of the polycrystalline silicon under a reaction pressure of 0.25 MPa to 0.9 MPa, when flow velocity of the source gas in gas supply ports of the source gas supply nozzles is represented as u (m/sec), a source gas supply amount is represented as Q (kg/sec), and an inner volume of the reaction furnace is represented as V (m$^3$), values of u and Q of each of the source gas supply nozzles such that a total $\Sigma(Q \times u^2/V)$ of values $Q \times u^2/V$ is equal to or larger than 2500 (kg/m·sec$^3$).

2. The method of supplying the source gas for polycrystalline silicon producing according to claim 1, wherein, when an area of a bottom plate of the reaction furnace is represented as S0, all of the one or more source gas supply nozzles provided in the reaction furnace are provided on an inner side of an imaginary concentric circle having a center in a center portion of the bottom plate and having an area S of $S_0/2$.

3. The method of supplying the source gas for polycrystalline silicon producing according to claim 2, wherein a reaction temperature in performing the deposition reaction of the polycrystalline silicon under a reaction pressure of 0.25 MPa to 0.9 MPa is set in a range of 980° C. to 1150° C.

4. The method of supplying the source gas for polycrystalline silicon producing according to claim 3, wherein, when the source gas flow velocity u is obtained such that the total $\Sigma(Q \times u^2/V)$ is equal to or larger than 2500 (kg/m·sec$^3$), pressure of the source gas supplied to the source gas supply nozzles is set to 1 MPa to 2 MPa.

5. The method of supplying the source gas for polycrystalline silicon producing according to claim 4, wherein the setting of the source gas pressure of 1 MPa to 2 MPa is performed by at least one of compression pressurization by a compressor for the source gas and vaporization at high temperature of a liquid material.

6. The method of supplying the source gas for polycrystalline silicon producing according to claim 1, wherein a reaction temperature in performing the deposition reaction of the polycrystalline silicon under a reaction pressure of 0.25 MPa to 0.9 MPa is set in a range of 980° C. to 1150° C.

7. The method of supplying the source gas for polycrystalline silicon producing according to claim 6, wherein, when the source gas flow velocity u is obtained such that the total $\Sigma(Q \times u^2/V)$ is equal to or larger than 2500 (kg/m·sec$^3$), pressure of the source gas supplied to the source gas supply nozzles is set to 1 MPa to 2 MPa.

8. The method of supplying the source gas for polycrystalline silicon producing according to claim 7, wherein the setting of the source gas pressure of 1 MPa to 2 MPa is performed by at least one of compression pressurization by a compressor for the source gas and vaporization at high temperature of a liquid material.

9. Polycrystalline silicon obtained by depositing the source gas for polycrystalline silicon producing supplied by the method according to claim 1.

* * * * *